(12) United States Patent  
O'Connell et al.

(10) Patent No.: US 9,065,434 B2  
(45) Date of Patent: Jun. 23, 2015

(54) INPUT CIRCUIT FOR INDUSTRIAL CONTROL WITH LOW HEAT DISSIPATION

(75) Inventors: John O'Connell, Painesville, OH (US); Dale Terdan, Concord Township, OH (US)

(73) Assignee: Rockwell Automation Technologies, Mayfield Heights, OH (US)

(*) Notice: Subject to any disclaimer, the term of this patent is extended or adjusted under 35 U.S.C. 154(b) by 542 days.

(21) Appl. No.: 13/474,351

(22) Filed: May 17, 2012

(65) Prior Publication Data

US 2013/0306886 A1 Nov. 21, 2013

(51) Int. Cl.
*G02B 27/00* (2006.01)
*H03K 5/08* (2006.01)
*H03K 5/1536* (2006.01)

(52) U.S. Cl.
CPC ............... *H03K 5/08* (2013.01); *H03K 5/1536* (2013.01)

(58) Field of Classification Search
CPC ......... H04B 1/587; H03K 5/08; H03K 5/1536
USPC .................................. 250/551; 379/394–398
See application file for complete search history.

(56) References Cited

U.S. PATENT DOCUMENTS

| 4,051,394 A | 9/1977 | Tieden |
| 4,929,871 A | 5/1990 | Gerfast |
| 5,465,298 A * | 11/1995 | Wilkison et al. ......... 379/406.02 |
| 5,579,144 A * | 11/1996 | Whitney ....................... 398/115 |
| 5,734,703 A * | 3/1998 | Hiyoshi ..................... 379/93.28 |
| 6,400,822 B1 * | 6/2002 | Anozie ........................... 379/398 |
| 2003/0161465 A1 | 8/2003 | Nakamura |

FOREIGN PATENT DOCUMENTS

EP 2339749 A1 6/2011

OTHER PUBLICATIONS

Extended European Search Report (EESR); European Patent Application No. 13 168 301.3; Sep. 18, 2014.

* cited by examiner

*Primary Examiner* — Seung C Sohn
(74) *Attorney, Agent, or Firm* — Boyle Fredrickson, S.C.

(57) ABSTRACT

An I/O circuit for use with an industrial controller provides an input circuit with low power dissipation through the use of a series connected substantially nonresistance impedance. An AC waveform input activates a light emitting diode (LED) bridge to provide an optical signal which illuminates a photosensitive solid-state switch thereby providing optical isolation between the industrial controller and the controlled process or machine. By using a series connected substantially nonresistance impedance, reduced current demand by the input circuit may be realized, which allows reduced power dissipation. As a result, the same circuit allows receiving input signals over a greater range, such as 120 volts AC and 240 volts AC, and allows significantly smaller components with closer spacing for a more compact design.

18 Claims, 4 Drawing Sheets

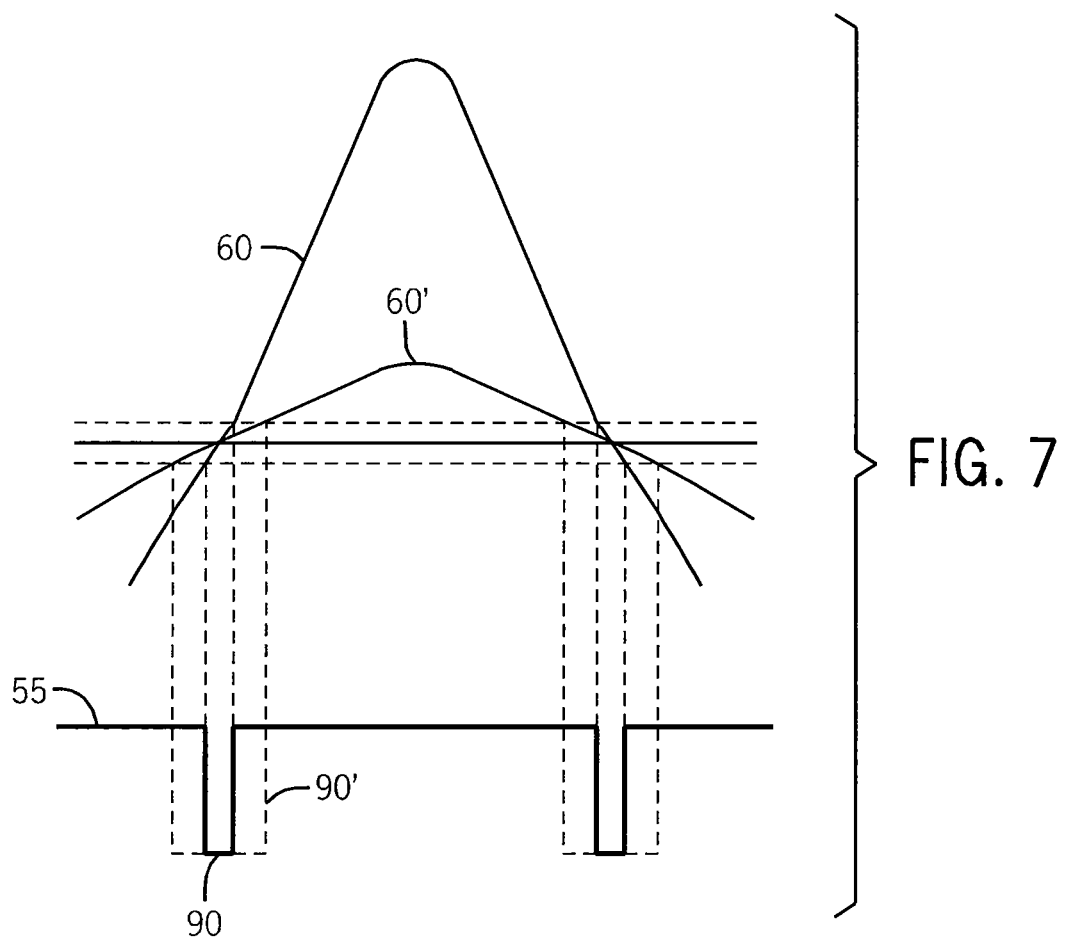

ically isolated from the circuitry communicating with the controlled process or machine (field-side) in order to prevent faults in the field-side from damaging the industrial control system or other I/O modules. For input circuits (such as AC input circuits) it can be necessary to receive the voltage signal from operation of the field-side circuitry to determine the frequency and/or amplitude of the signal from the controller-side. To prevent excess power from damaging the I/O module, a voltage dropping series resistor is often used converting the high voltage from the field-side into a lower voltage suitable for optical isolation to the controller-side. Such voltage dropping series resistors are often physically large to handle the necessary power dissipation and must be spaced apart to aid in dissipating the incident heat.

INPUT CIRCUIT FOR INDUSTRIAL CONTROL WITH LOW HEAT DISSIPATION

BACKGROUND OF THE INVENTION

The present invention relates to I/O modules for industrial control systems and in particular to a low heat dissipation I/O module that may flexibly accommodate input AC waveforms over a range of AC voltages.

Industrial controllers are specialized computer systems used for the control of industrial processes or machinery, for example, in a factory environment. Industrial controllers differ from conventional computers in a number of ways. Physically, they are constructed to be substantially more robust against shock and damage and to better resist external contaminants and extreme environmental conditions. The processors and operating systems are optimized for real-time control and execute languages allowing ready customization of programs to comport with a variety of different controller applications. Typically, the controllers have a highly modular architecture that allows different numbers and types of input and output modules to be used to connect the controllers to the process or machinery to be controlled. This modularity is facilitated through the use of special "control networks" suitable for highly reliable and available real-time communication. Such control networks (for example, Ethernet IP) differ from standard communication networks (e.g. Ethernet) by guaranteeing maximum communication delays, for example, as obtained by pre-scheduling the bandwidth of the network, and/or providing redundant communication capabilities to high-availability.

As part of their enhanced modularity, industrial controllers may employ I/O modules dedicated to a particular type electrical signal and function, for example, detecting input AC or DC signals or controlling output AC or DC signals. Each of these I/O modules may have a connector system allowing them to be installed in different combinations in a housing or unit along with other selected I/O modules to match the demands of the particular application. Multiple units may be located at convenient control points near the controlled process or machine to communicate with a central industrial controller via a special control network such as Ethernet IP. Normally different I/O modules are required for receiving different AC and DC signals from the industrial processes or machinery, reflecting differences in the devices used. Different I/O modules may be used, for example, for receiving input signals operating around 120 volts AC as opposed to 240 volts AC.

The circuitry of the I/O module communicating with the industrial controller (controller-side) is also typically optically isolated from the circuitry communicating with the controlled process or machine (field-side) in order to prevent faults in the field-side from damaging the industrial control system or other I/O modules. For input circuits (such as AC input circuits) it can be necessary to receive the voltage signal from operation of the field-side circuitry to determine the frequency and/or amplitude of the signal from the controller-side. To prevent excess power from damaging the I/O module, a voltage dropping series resistor is often used converting the high voltage from the field-side into a lower voltage suitable for optical isolation to the controller-side. Such voltage dropping series resistors are often physically large to handle the necessary power dissipation and must be spaced apart to aid in dissipating the incident heat.

SUMMARY OF THE INVENTION

The present invention provides a series connected substantially nonresistance impedance for receiving the AC waveform and limiting the current of the AC waveform. By using a series connected substantially nonresistance impedance, current may be limited without the dissipation of heat energy. This is because the impedance of the substantially nonresistance impedance is comprised primarily of electrical reactance. Reactance may be characterized as the opposition of a circuit element to a change of electric current or voltage due to that element's electric or magnetic field. An electric field may resist the change of voltage on a circuit element while a magnetic field may resist the change of current. In contrast, a primarily electrical resistance may simply oppose the passage of electric current through the circuit element and dissipate heat energy.

It is thus a feature of at least one embodiment of the invention to provide reduced power dissipation, to receive input signals over a greater voltage range and/or achieve a more compact design.

The circuit also provides an optical isolator comprising a light emitting diode (LED) bridge coupled in series with the series connected substantially nonresistance impedance and operative to transmit light only when the magnitude of the voltage of the AC waveform is greater than a threshold, and having a photosensitive solid-state switch for receiving light from the LED bridge to provide an optically isolated signal.

It is thus a feature of at least one embodiment of the invention to provide an isolated monitoring of the input voltage The LED bridge may comprise, for example, a first LED and a second LED wherein a cathode of the first LED is connected to an anode of the second LED and a cathode of the second LED is connected to an anode of the first LED. In this instance, the threshold may be a first predetermined threshold voltage for the first LED to conduct when the first LED is forward biased and a second predetermined voltage threshold for the second LED to conduct when the second LED is forward biased.

The photosensitive solid-state switch may comprise, for example, a photosensitive NPN transistor. The substantially non-resistance impedance may limit the current of the AC waveform through the LED to a predetermined operating current of the LED in a range of 120 volts AC to 240 volts AC. The series connected substantially nonresistance impedance may comprise an inductor, and may further comprise a capacitor in series with the inductor. The capacitor in series with the inductor may be for example a multi-layer ceramic capacitor.

The I/O module circuit may further include a microprocessor for receiving the optically isolated signal and determining the frequency and/or the amplitude of the optically isolated signal. It is thus a feature of at least one embodiment of the invention to determine frequency and/or amplitude from the signal.

The I/O module circuit may also include a terminal that is a screw type terminal. The I/O module circuit may also have a unit having multiple unit releasable electrical connectors, the unit supporting multiple I/O module circuits each having releasable electrical connectors connecting with the unit releasable electrical connectors, and wherein the unit includes elements for orienting and supporting the I/O module in the unit.

In another embodiment, the present invention provides an industrial control system comprising an industrial controller having at least one processor executing a stored program to receive input signals reflecting a state of a connected industrial process, a network providing a protocol ensuring a guaranteed maximum delay in a communication of data on the network system communicating with the industrial controller to communicate input signals therewith and an I/O module communicating with the network system to exchange the input signals therewith. The I/O module may further comprise a housing, a terminal supported by the housing for receipt of an AC waveform, and a circuit contained in the housing. The circuit provides a series connected substantially nonresistance impedance for receiving the AC waveform and limiting the current of the AC waveform. The circuit also provides an optical isolator comprising a light emitting diode (LED) bridge coupled in series with the series connected substantially nonresistance impedance and operative to transmit light only when the magnitude of the voltage of the AC waveform is greater than a threshold, and having a photosensitive solid-state switch for receiving light from the LED bridge to provide an optically isolated signal.

In yet another embodiment, the present invention provides a method of receiving an AC input signal in an I/O module in an industrial control system comprising receiving an AC waveform at a terminals of the I/O module connected in series with a substantially nonresistance impedance for limiting the current of the AC waveform and optically isolating the AC waveform using an optical isolator comprising a light emitting diode (LED) bridge coupled in series with the series connected substantially nonresistance impedance and operative to transmit light only when the magnitude of the voltage of the AC waveform is greater than a threshold, and having a photosensitive solid-state switch for receiving light from the LED bridge to provide an optically isolated signal.

These particular objects and advantages may apply to only some embodiments falling within the claims and thus do not define the scope of the invention.

BRIEF DESCRIPTION OF THE DRAWINGS

FIG. 7 is aligned graphs showing a change in the width of the pulse of FIG. 6 with different amplitudes of AC waveforms allowing indirect amplitude monitoring.

DETAILED DESCRIPTION OF THE PREFERRED EMBODIMENT

Figure 1:
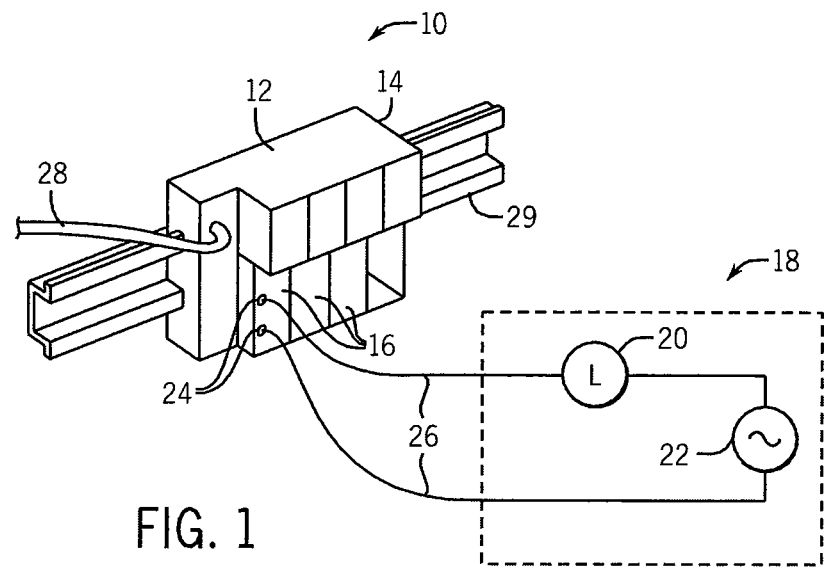
FIG. 1 is a perspective view of a remote I/O unit of a type suitable for use with the present invention showing a housing having multiple I/O modules contained therein for communication with an industrial process via terminals and a remote industrial controller via a network cable.
Figure 2:
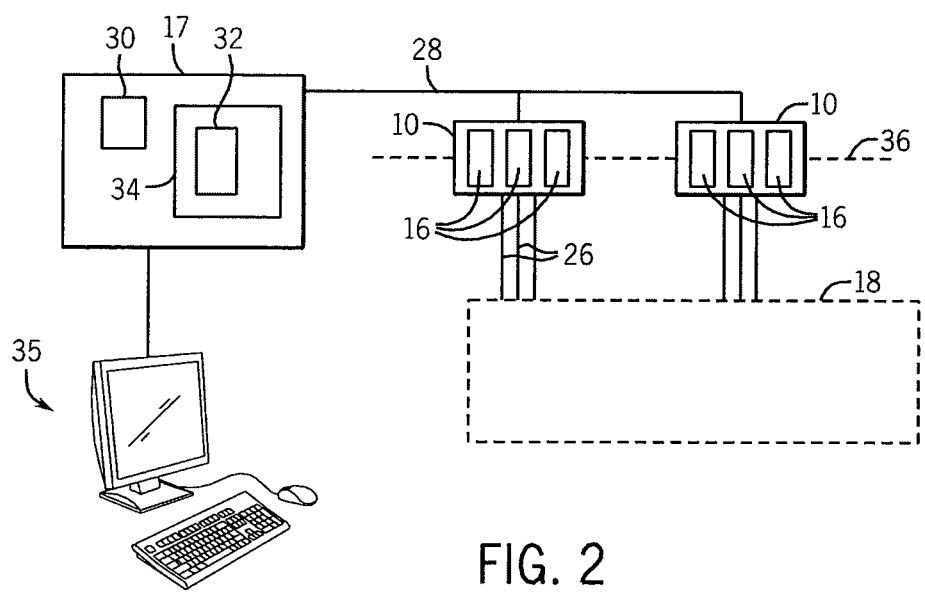
FIG. 2 is a block diagram showing the I/O unit of FIG. 1 in the context of the industrial control system incorporating multiple remote I/O units and an industrial controller.

Referring now to FIGS. 1 and 2, an I/O block 10 may provide for a unit housing 12 having multiple openings 14 for orienting and supporting corresponding replaceable or permanently installed I/O modules 16. The I/O modules 16 generally provide an electrical interface between an industrial controller 17 and an industrial process or machine 18, the latter having actuators presenting loads 20 as powered by external field-side power sources 22 which may be AC sources (as shown) or DC sources as will be described. Each of the I/O modules 16 may have exposed screw terminals 24 for connecting circuitry of the I/O module 16 via electrical conductors 26 to the load 20 and field-side power source 22 of the industrial process or machine 18.

The housing 12 of the I/O block 10 may be supported, for example, on a DIN rail 29 of a type known in the art or may provide for another mounting arrangement allowing it to be located close to the desired controlled loads 20. The I/O block 10 may connect via a control network 28, for example ControlNet or Ethernet IP, to industrial controller 17 for communication of control data between the I/O modules 16 of the I/O block 10 and the industrial controller 17.

Generally, the industrial controller 17 will include at least one processor 30 executing a stored control program 32 contained in a communicating memory 34 to provide for communication with the control network 28 to exchange signals with the I/O block 10 for control of the industrial process or machine 18 according to a stored control program 32. The stored control program 32 reads signals indicating the state of the industrial process or machine 18 (from sensors or the like) and writes outputs to the I/O block 10 to control the loads 20 according to those sensed inputs and the logic of the control program 32. The industrial controller 17 may include a connection to a user interface terminal 35 (for example including a display, computer, keyboard, and mouse or the like) allowing programming and other control of the industrial controller 17 and providing for output of information to an operator. Industrial controllers 17 suitable for use with the present invention include, for example, programmable controllers commercially available from Rockwell Automation, Inc.

Generally, the I/O modules 16 of each I/O block 10 include an electrical isolation barrier 36 between the electrical power and circuitry of the industrial process or machine 18 and directly connected portions of the I/O module 16, and the circuitry of the industrial control system including the industrial controller 17, the network 28, the I/O blocks 10 and remaining portions of the I/O modules 16. Electrical isolation, as understood herein, refers to the portions of an electrical circuit and do not communicate by a DC electric path within the I/O block 10. Circuitry on the side of the electrical isolation barrier 36 toward the industrial process or machine 18 will be termed "field-side" circuitry and circuitry on the side of the electrical isolation towards the industrial controller 17 will be termed "controller-side" circuitry. Electrical isolation, as is understood in the art, may be accomplished by an optical isolator or transformer that prevents DC conduction through the electrical isolation barrier 36 to prevent damage to the controller-side circuitry in the event of fault on the field-side circuitry. This isolation prevents simple sharing of electrical power between the circuits on the controller-side in the field-side by conductors spanning the isolation barrier 36.

Figure 3:
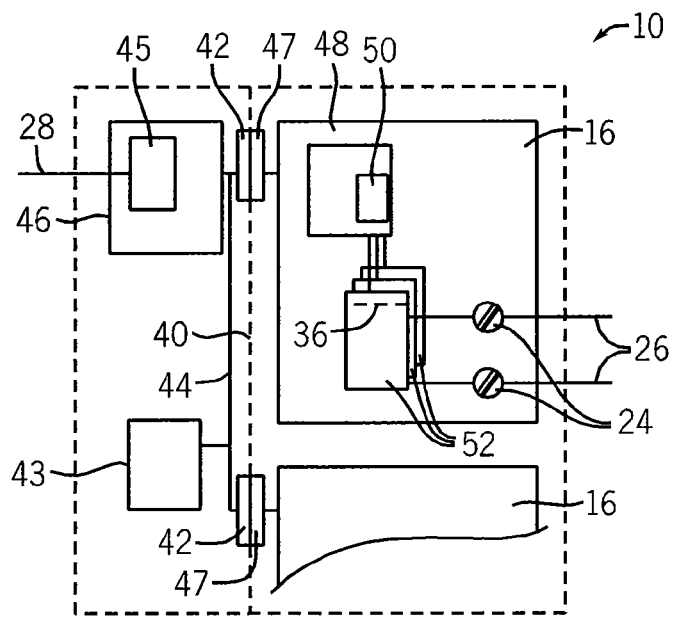
FIG. 3 is a block diagram of the remote I/O unit showing connectors for attaching I/O modules installed in the I/O unit to a common bus communicating with the network cable and electrical power, and showing one I/O module providing an input circuit.

Referring now to FIG. 3, each I/O block 10 may provide a backplane 40 providing a set of electrically releasable or permanently connected electrical connectors 42 communicating with a backplane bus 44 providing parallel or serial digital communication and electrical power. Electrical power may be provided by a power supply 43. The digital communication on the backplane bus 44 may be moderated by a unit controller 46 including network circuit 45 communicating with the industrial control network 28. The unit controller 46 and network circuit 45 may be, for example, one or more electronic processors executing a stored program stored in memory or the like.

The electrical connectors 42 forming the backplane bus 44 may connect with corresponding electrical connectors 47 positioned at the rear of each I/O module 16 allowing electrical connection between controller-side circuitry of the I/O block 10 and the controller-side circuitry of the I/O module 16 for directly communicating data and power therebetween when an I/O module 16 is inserted into the I/O block 10. Within each I/O module 16, a module controller 48, for example a microcontroller, may execute a stored program 50 to coordinate functions of the I/O module 16 by communicating with multiple input circuits 52. Each of these input circuits 52 may provide internally for an electrical isolation barrier 36 between controller-side and field-side circuitry as will be described. Each of these input circuits 52 also communicate with a set of terminals 24 (only two shown for clarity) that may, for example, be screw type terminals releasably receiving electrical conductors 26.

Figure 4:
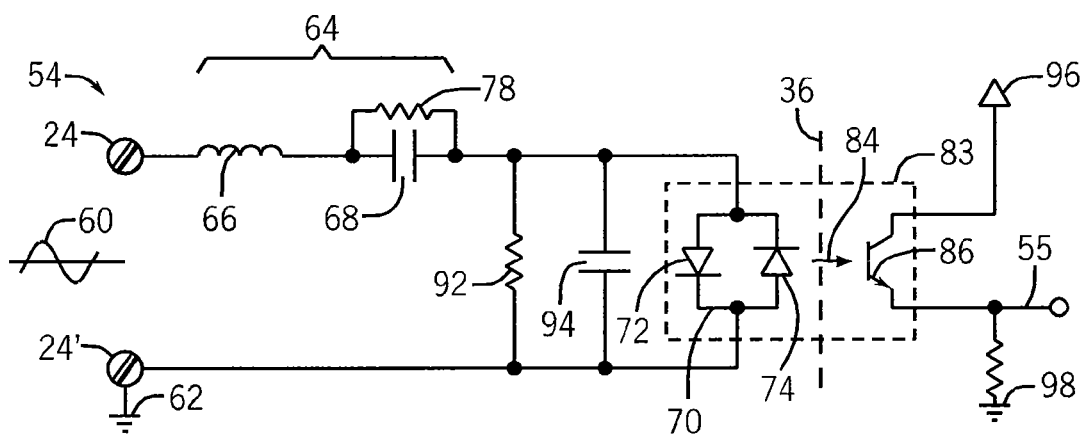
FIG. 4 is a detailed schematic of the input circuit of FIG. 3 such as may receive an AC waveform from the input terminals to provide an isolated signal through an optical isolator.

Referring now to FIG. 4, the input circuit 52 may receive an AC waveform 60 across the terminals 24, for example a ground reference 62 at one terminal 24' and the AC waveform at terminal 24. The AC waveform will, in one embodiment, be at approximately 60 Hz and have a voltage between 120 and 240 volts AC.

The terminal 24 receiving the AC waveform may connect to a substantially nonresistance impedance element 64 comprising a series connected inductor 66 and capacitor 68. Impedance element 64 may be sized to provide the necessary voltage drop and to limit current flow. It will be understood that a primarily reactive impedance element 64 may block current flow without dissipating substantial energy in contrast to a blocking resistance so that substantially no heat is generated in this current limiting process. Impedance element 64 may also comprise a large resistance value resistor 78 in parallel with capacitor 68 for allowing discharge of capacitor 68, for example, upon removal of the module. In an alternative embodiment, one or more portions of impedance element 64 may be connected to terminal 24' instead or in addition to terminal 24.

Impedance element 64 in turn connects to a light emitting diode (LED) bridge 70 being part of an optical isolator 83. The LED bridge 70 may comprise a first LED 72 and a second LED 74 wherein the cathode of the first LED 72 connects to the anode of the second LED 74 and the cathode of the second LED 74 connects to the anode of the first LED 72. The impedance element 64 connects to the LED bridge 70 where the cathode of the second LED 74 connects to the anode of the first LED 72. The LED bridge 70 in turn connects to ground reference 62 where the cathode of the first LED 72 connects to the anode of the second LED 74.

When the first LED 72 or the second LED 74 of LED bridge 70 is turned on, that LED is illuminated providing optical signal 84 to phototransistor 86 of the optical isolator 83 finding the isolation barrier 36. The first LED 72 may turn on, for example, when the AC waveform exceeds a first predetermined voltage, which may be a threshold voltage of about 1 volt for forward biasing the first LED 72. The second LED 74 may turn on, for example, when the AC waveform falls below a second predetermined voltage, which may be then a threshold voltage of about −1 volt for forward biasing the second LED 74. As a result, the LED bridge 70 is operative to transmit light when the voltage of the AC waveform is greater than the first and second predetermined voltage thresholds or when the voltage of the AC waveform is less than the first and second predetermined voltage thresholds. In addition, the LED bridge 70 is operative to not transmit light when the voltage of the AC waveform is within the first and second predetermined voltage thresholds. The phototransistor 86 may then send the output signal 55, as described above, leading to module controller 48 shown in FIG. 3, using controller-side power 96 and controller-side ground 98 references isolated from the field-side.

Impedance element 64 may also connect to discrete elements, for example, resistor 92 and capacitor 94, each in turn connecting to ground reference 62. These discrete elements may provide additional filtering for the AC waveform and/or electrostatic discharge protection.

Figure 5:
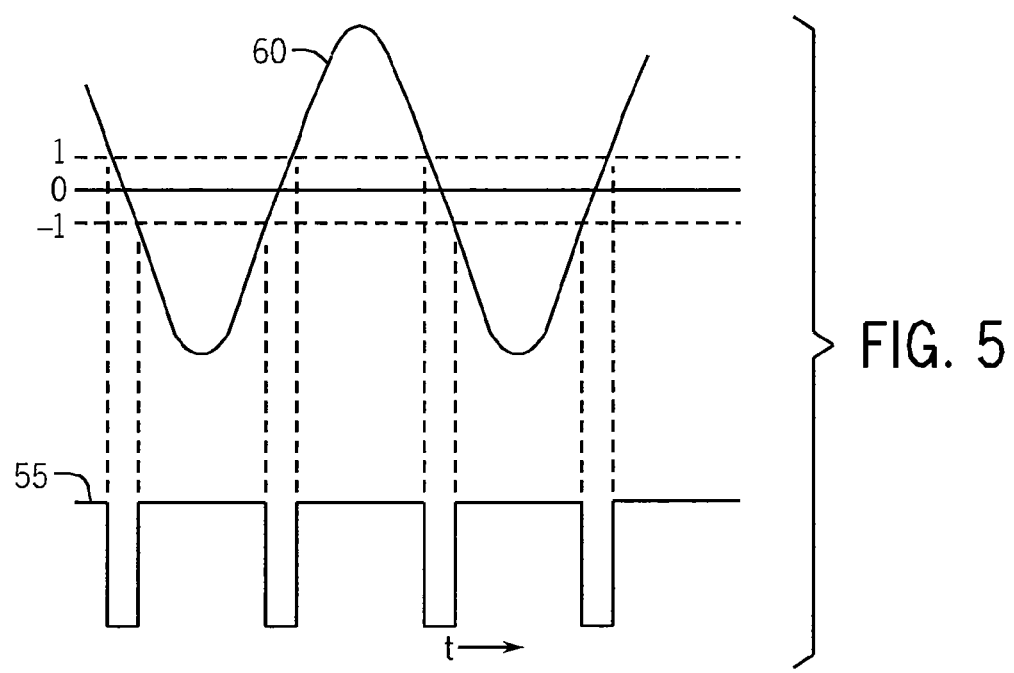
FIG. 5 is aligned graphs showing the AC waveform and the switching of the LED bridge of the optical isolator for a short period of time.
Figure 6:
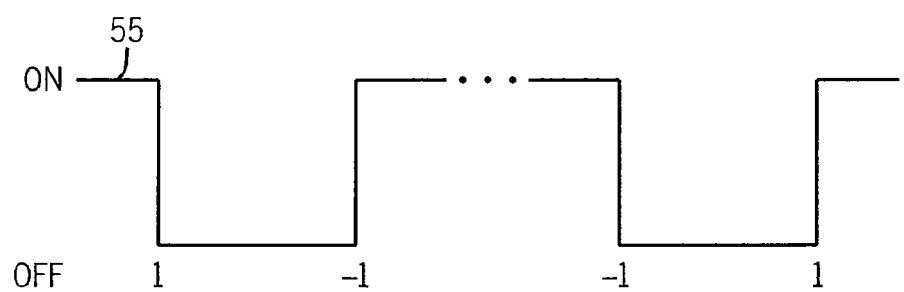
FIG. 6 is a plot of the state of switching of the LED bridge of the optical isolator versus AC waveform voltage for the circuit of FIG. 4.

Referring now also to FIGS. 5 and 6, when the AC waveform 60 connected between terminals 24 and 24' is at a voltage that is above the first predetermined voltage threshold of about 1 volt, and thus above the second predetermined voltage threshold of about −1 volt, LED bridge 70 is turned on providing optical signal 84 to phototransistor 86. As a result, phototransistor 86 conducts to output signal 55.

When the AC waveform 60 is between approximately the first predetermined voltage threshold of about 1 volt and the second predetermined voltage threshold of about −1 volt, LED bridge 70 is turned off and no optical signal 84 is provided to phototransistor 86. As a result, phototransistor 86 stops conduction to output signal 55.

When the AC waveform 60 falls below the second predetermined voltage threshold of about −1 volt, and thus below the first predetermined voltage threshold of about 1 volt, LED bridge 70 is turned on providing optical signal 84 to phototransistor 86. As a result, phototransistor 86 conducts to the output signal 55.

Referring now to FIG. 7, it will be understood that the width of the pulse of output signal 55 can be used to determine a coarse voltage level of the AC waveform 60 within AC waveform. For example, when the AC waveform 60 is 240 volts, the voltage swing will be steeper resulting in a relatively narrow pulse 90 measured in absolute time. Conversely, when the AC waveform 60' is a relatively lower voltage, for example 120 volts, the voltage swing will be slower extending the pulse of base voltage 90'. In this way, operation of the I/O module at 120 or 240 volts may be determined and other simple voltage measurements may be made.

Certain terminology is used herein for purposes of reference only, and thus is not intended to be limiting. For example, terms such as "upper," "lower," "above," and "below" refer to directions in the drawings to which reference is made. Terms such as "front," "back," "rear," "bottom" and "side" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor" can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network. Co-pending patent applications entitled Output Module For Industrial Control With Sink And Source Capability And Low Heat Dissipation, Ser. No. 13/473,711, and Zero-Crossing Detector For Industrial Control With Low Heat Dissipation, Ser. No. 13/474,348, now U.S. Pat. No. 8,669,787, filed on even date herewith and assigned to the same assignee as the present invention are hereby incorporated by reference in their entirety.

It is specifically intended that the present invention not be limited to the embodiments and illustrations contained herein and the claims should be understood to include modified forms of those embodiments including portions of the embodiments and combinations of elements of different embodiments as coming within the scope of the following claims. All of the publications described herein including patents and non-patent publications are hereby incorporated herein by reference in their entireties.

What we claim is:

1. An I/O module circuit for use in an industrial control system comprising:
   a housing;
   a terminal supported by the housing for receipt of an AC waveform; and
   a circuit contained in the housing providing:
   a series connected substantially nonresistance impedance comprising an inductor, the series connected substantially nonresistance impedance for receiving the AC waveform and limiting the current of the AC waveform;
   an optical isolator comprising a light emitting diode (LED) bridge coupled in series with the series connected substantially nonresistance impedance and operative to transmit light only when the magnitude of the voltage of the AC waveform is greater than a threshold, and having a photosensitive solid-state switch for receiving light from the LED bridge to provide an optically isolated signal.

2. The I/O module circuit of claim 1 wherein the LED bridge comprises a first LED and a second LED wherein a cathode of the first LED is connected to an anode of the second LED and a cathode of the second LED is connected to an anode of the first LED.

3. The I/O module circuit of claim 2 wherein the threshold is a first predetermined threshold voltage for the first LED to conduct when the first LED is forward biased and a second predetermined voltage threshold for the second LED to conduct when the second LED is forward biased.

4. The I/O module circuit of claim 1 wherein the photosensitive solid-state switch comprises a photosensitive NPN transistor.

5. The I/O module circuit of claim 4 wherein the substantially non-resistance impedance limits the current of the AC waveform through the LED to a predetermined operating current of the LED in a range of 120 volts AC to 240 volts AC.

6. The I/O module circuit of claim 1 wherein the series connected substantially nonresistance impedance further comprises a capacitor in series with the inductor.

7. The I/O module circuit of claim 6 wherein the capacitor is a multi-layer ceramic capacitor.

8. The I/O module circuit of claim 1 further including a microprocessor for receiving the optically isolated signal and determining the frequency of the optically isolated signal.

9. The I/O module circuit of claim 1 further including a microprocessor for receiving the optically isolated signal and determining the amplitude of the optically isolated signal.

10. The I/O module circuit of claim 1 wherein the terminal is a screw type terminal.

11. The I/O module circuit of claim 1 further including a unit having multiple unit releasable electrical connectors, the unit supporting multiple I/O module circuits each having releasable electrical connectors connecting with the unit releasable electrical connectors; wherein the unit includes elements for orienting and supporting the I/O module in the unit.

12. An industrial control system comprising:
    an industrial controller having at least one processor executing a stored program to receive input signals reflecting a state of a connected industrial process;
    a network providing a protocol ensuring a guaranteed maximum delay in a communication of data on the network system communicating with the industrial controller to communicate input signals therewith;
    an I/O module communicating with the network system to exchange the input signals therewith, the I/O module further comprising:
    a housing;
    a terminal supported by the housing for receipt of an AC waveform; and
    a circuit contained in the housing providing:
    a series connected substantially nonresistance impedance comprising an inductor, the series connected substantially nonresistance impedance for receiving the AC waveform and limiting the current of the AC waveform;
    an optical isolator comprising a light emitting diode (LED) bridge coupled in series with the series connected substantially nonresistance impedance and operative to transmit light only when the magnitude of the voltage of the AC waveform is greater than a threshold, and having a photosensitive solid-state switch for receiving light from the LED bridge to provide an optically isolated signal.

13. The industrial control system of claim 12 wherein the LED bridge comprises a first LED and a second LED wherein a cathode of the first LED is connected to an anode of the second LED and a cathode of the second LED is connected to an anode of the first LED.

14. The industrial control system of claim 12 wherein the photosensitive solid-state switch comprises a photosensitive NPN transistor.

15. The industrial control system of claim 14 wherein the substantially non-resistance impedance limits the current of the AC waveform through the LED to a predetermined operating current of the LED in a range of 120 volts AC to 240 volts AC.

16. The industrial control system of claim 12 wherein the series connected substantially nonresistance impedance further comprises a capacitor in series with the inductor.

17. The industrial control system of claim 12 further including a microprocessor for receiving the optically isolated signal and determining the frequency of the optically isolated signal.

18. A method of receiving an AC input signal in an I/O module in an industrial control system comprising:
  receiving an AC waveform at a terminals of the I/O module connected in series with a substantially nonresistance impedance comprising an inductor, the series connected substantially nonresistance impedance for limiting the current of the AC waveform;
  optically isolating the AC waveform using an optical isolator comprising a light emitting diode (LED) bridge coupled in series with the series connected substantially nonresistance impedance and operative to transmit light only when the magnitude of the voltage of the AC waveform is greater than a threshold, and having a photosensitive solid-state switch for receiving light from the LED bridge to provide an optically isolated signal.

* * * * *